(12) United States Patent
Huang et al.

(10) Patent No.: US 8,564,031 B2
(45) Date of Patent: Oct. 22, 2013

(54) HIGH VOLTAGE-RESISTANT LATERAL DOUBLE-DIFFUSED TRANSISTOR BASED ON NANOWIRE DEVICE

(75) Inventors: Ru Huang, Beijing (CN); Jibin Zou, Beijing (CN); Runsheng Wang, Beijing (CN); Gengyu Yang, Beijing (CN); Yujie Ai, Beijing (CN); Jiewen Fan, Beijing (CN)

(73) Assignee: Peking University, Beijing (CN)

( * ) Notice: Subject to any disclaimer, the term of this patent is extended or adjusted under 35 U.S.C. 154(b) by 22 days.

(21) Appl. No.: 13/381,633

(22) PCT Filed: Apr. 1, 2011

(86) PCT No.: PCT/CN2011/072395
§ 371 (c)(1),
(2), (4) Date: Dec. 29, 2011

(87) PCT Pub. No.: WO2012/100458
PCT Pub. Date: Aug. 2, 2012

(65) Prior Publication Data
US 2012/0199808 A1 Aug. 9, 2012

(51) Int. Cl.
*H01L 29/76* (2006.01)
(52) U.S. Cl.
USPC .................. 257/288; 257/E29.245; 977/765
(58) Field of Classification Search
CPC .. B82Y 10/00; B82Y 120/00; H01L 29/0665; H01L 29/6658; H01L 29/7833; H01L 21/823807

USPC .............. 257/9, 213, 288, E29.245; 977/762, 977/765, 766
See application file for complete search history.

(56) References Cited

U.S. PATENT DOCUMENTS

| 6,410,463 | B1 * | 6/2002 | Matsuki ..................... 438/790 |
| 7,495,286 | B2 | 2/2009 | Lee |
| 2006/0226425 | A1 * | 10/2006 | Chae et al. ................... 257/59 |
| 2007/0161213 | A1 * | 7/2007 | Hiura et al. .................. 438/478 |

FOREIGN PATENT DOCUMENTS

| CN | 1641886 A | 7/2005 |
| CN | 101257047 A | 9/2008 |

* cited by examiner

*Primary Examiner* — Nikolay Yushin
(74) *Attorney, Agent, or Firm* — Foley & Lardner LLP; Antoinette F. Konski

(57) ABSTRACT

The invention provides a high voltage-resistant lateral double-diffused transistor. The lateral double-diffused MOS transistor includes a channel region, a gate dielectric, a gate region, a source region, a drain region, a source end extension region and a drain end S-shaped drifting region, wherein the channel region has a lateral cylindrical silicon nanowire structure, on which a layer of gate dielectric is uniformly covered, the gate region is on the gate dielectric, the gate region and the gate dielectric completely surround the channel region, the source end extension region lies between the source region and the channel region, the drain end S-shaped drifting region lies between the drain region and the channel region, the plan view of the drain end S-shaped drifting region is in the form of single or multiple S-shaped structure(s), and an insulating material with a relative dielectric constant of 1-4 is filled within the S-shaped structure(s).

7 Claims, 3 Drawing Sheets

HIGH VOLTAGE-RESISTANT LATERAL DOUBLE-DIFFUSED TRANSISTOR BASED ON NANOWIRE DEVICE

CROSS-REFERENCE TO RELATED APPLICATIONS

This application is a national stage application under 35 U.S.C. §371 of International Application No. PCT/CN2011/072395, filed Apr. 1, 2011, which in turn claims priority under 35 U.S.C. §119(a) to Chinese Patent Application No. 201110029706.7, filed Jan. 27, 2011, the contents of which are hereby incorporated by reference into the present disclosure.

FIELD OF THE INVENTION

The present invention relates to a lateral double-diffused MOS transistors in the field of microelectronics semiconductor devices, and in particular, to a lateral double-diffused transistor based on a silicon nanowire MOS transistor, which is suitable for application in a radio frequency (RF) power amplifier or other high-voltage circuits.

BACKGROUND OF THE INVENTION

With the development of RF circuits, RF devices gain more and more attention in radio communications, for example, personal/commercial radio communication apparatus, mobile communication apparatus and even some important fields such as military radars, etc., and the demands on thereof also increases year by year. In the transceiver systems of a RF circuit, a power amplifier is a very important module. However, a power amplifier is generally required to process a signal with a large amplitude and to have a good stability, which requires that the core elements of the circuits of the power amplifier have a good high voltage-resistant capability. Generally, the core elements of such circuits are manufactured by employing complex processes with expensive special materials or manufactured by employing planar lateral double-diffused field effect transistors (planar LDMOS). Although the planar lateral double-diffused field effect transistor is compatible with the conventional CMOS process, under the background that the improvement of the key processing steps such as lithographying in the CMOS process is limited and the object of batch production via advanced technologies cannot be attained, the structure of the planar transistor causes a continual increase of cost and a reduction of the yield. At present, taking 45 nm flat tube process as an example, the technology has reached the process limit, and a serious short channel effect will be introduced into the flat tube, which results in an increase of the off-state current and a reduction of transconductance in the device. At the same time, since a lateral double-diffused field effect transistor with a planar-structure has a large drain/substrate conjunction reverse bias during the normal operation, a large drain/substrate leakage current exists, which affects the precision of the output current, and the large drain/substrate reverse bias may even result in the device is brokendown soon and thus reduce the high voltage-resistant capability of the LDMOS.

On one hand, silicon nanowire MOS field-effect transistor (Silicon Nanowire MOSFET) may attain an excellent gate control capability, mitigate the short channel effect and overcome the problem that it is difficult for an ordinary planar transistor to reduce the characteristic size of a device. On the other hand, because of the floating channel structure, the effect of no substrate is obtained, and the LDMOS consisted thereby may overcome the problem of large leakage current and quick breakdown in a planar LDMOS.

Therefore, by using the high voltage-resistant lateral double-diffused field effect transistor manufactured based on a nanowire MOS field-effect transistor, a good choice is provided for further improving the integration degree and the performance of an ultra-large scale integrated circuit. Moreover, a good choice is provided for a power amplifier module or other high-voltage circuits requiring a reliable and stable operation.

SUMMARY OF THE INVENTION

Directed to the prior art, the present invention provides a lateral double-diffused transistor based on a silicon nanowire MOS transistor, which is suitable for an RF power amplifier or other high-voltage circuits.

The technical solutions of the invention are as follows:

A high voltage-resistant lateral double-diffused MOS transistor based on a silicon nanowire MOS transistor, includes a channel region, a gate dielectric, a gate region, a source region, a drain region, a source end extension region and a drain end S-shaped drifting region.

The channel region is the core portion of the surrounding gate silicon nanowire field-effect transistor and has a lateral cylindrical structure on which a layer of gate dielectric is uniformly covered. The gate region is on top of the gate dielectric, and the gate region and the gate dielectric completely surround the silicon nanowire. The length of the channel region is in the range of 10 nm-10 μm. The cylinder radius is in the range of 3-5 nm, and the cylinder is not doped. The thickness of the gate dielectric is in the range of 1-2.5 nm. The thickness of the gate region is in the range of 10 nm-5 μm.

The source region is flush with the drain region both at the upper and lower surfaces. The source region and the drain region are respectively connected to the source end extension region and the drain end S-shaped drifting region. High-concentration doping is employed, and the doping concentration is in the range of $10^{20}$-$10^{21}$ cm$^{-3}$.

The source end extension region lies between the source region and the channel region, characterized in that the doping concentration thereof is the same as that of the source region so as to obtain a very low resistance. The length of the source end extension region is in the range of 20 nm-100 nm. The reason for keeping a certain length is to reduce the parasitic capacitance of the drain region and the gate region. The doping concentration of the source end extension region is in the range of $10^{20}$-$10^{21}$ cm$^{-3}$.

The drain end S-shaped drifting region lies between the drain region and the channel region, which has the following structural characteristics.

1) In comparison with the source end extension region, the drain end S-shaped drifting region has a lower doping concentration in the range of $10^{12}$-$10^{18}$ cm$^{-3}$.

2) The plan view of the drain end S-shaped drifting region is in the form of single or multiple S-shaped structure(s). The total length is 1 μm-2 μm; the size of each back-track in the S-shaped structure is 50 nm-100 nm (lognitudinal)×100 nm-200 nm (lateral); and the number of S-shaped back-tracks is 1-5.

3) An insulating material with a low relative dielectric constant is filled within the S-shaped structure, and the relative dielectric constant is 1-4.

In comparison with the prior art, the effects of the invention are as follows.

A lateral double-diffused transistor suitable for an RF power amplifier or other high-voltage circuits is manufactured based on a silicon nanowire MOS transistor, so that the drain/substrate current introduced into a planar LDMOS due to the large drain/substrate voltage is avoided, and it is avoided that the drain/substrate conjunction reverse breakdown decreases the breakdown voltage of the LDMOS. At the same time, because of the excellent gate control capability of the silicon nanowire device, the off-state current is reduced, and a relatively large transconductance may be obtained. The drain end S-shaped drifting region plays the role of generating more potential drops in the insulating material surrounding the back-tracks via a multiple back-track S-shaped structure with a low doping concentration and the material with a low relative dielectric constant filled between the S-shaped back-tracks, so that the maximum electric-field intensity in the direction of the carrier path from the channel region to the drain region is reduced, the electric field distribution in direction of the carrier path is uniform, and the avalanche breakdown effect that may be caused by a high intensity electric field is avoided, which is favourable to increase the breakdown voltage of an element.

BRIEF DESCRIPTION OF THE DRAWINGS

FIG. 3 to FIG. 9 are schematic diagrams showing the manufacturing process of the invention, wherein:
in FIG. 3:
12-heavily-doped source end, 13-heavily-doped drain end, 14-mask, 15-silicon wafer substrate;
in FIG. 4:
16-mask, 17-lightly-doped region;
in FIG. 5:
18-S-shaped mask
in FIG. 6:
18-S-shaped mask, 20-lightly-doped region, 21-heavily-doped source region, 22-heavily-doped drain region;
in FIG. 7:
23-thick oxide layer deposition, 24-hollowed part formed by isotropically etching the part under the channel;
in FIG. 8:
4-source end extension region, 26-channel region, 5-drain end S-shaped drifting region, 28-oxide layer;
in FIG. 9:
29-insulating dielectric with a low relative dielectric constant, 3-gate region, 31-thick oxide layer.

DETAILED DESCRIPTION OF THE EMBODIMENTS

The invention will be further described in detail below with combination of the drawings and specific embodiments.

Figure 1:
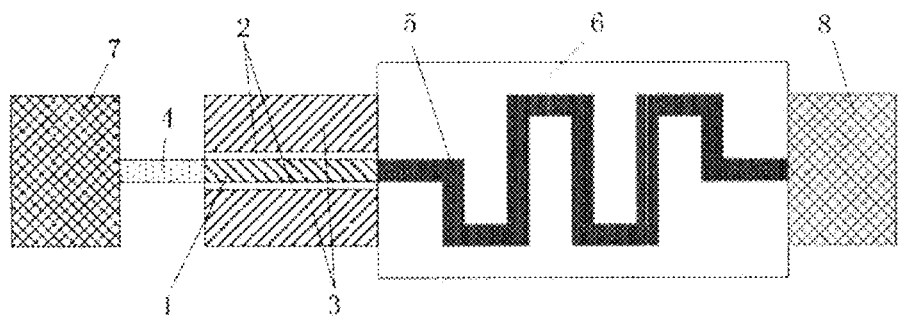
FIG. 1 is a schematic plan view of the cross-section of a lateral double-diffused transistor based on a silicon nanowire MOS transistor according to the invention, wherein:
1-channel region, 2-gate dielectric, 3-gate region, 4-source end extension region, 5-drain end S-shaped drifting region, 6-insulating dielectric with a low relative dielectric constant surrounding the back-tracks of the S-shaped drifting region, 7-source region, 8-drain region.

FIG. 1 is a schematic plan view of the cross-section of the core part of a lateral double-diffused transistor based on a silicon nanowire MOS transistor according to the invention. The difference between the structure of the transistor and that of a conventional silicon nanowire MOS transistor lies in that.

1) The connection mode between the channel part and the drain region: in the invention, the drain end S-shaped drifting region is used as the connection part, the shape characteristic of which is S-shaped.
2) The connection region between the channel part and the drain region (in the invention, the connection region is the drain end S-shaped drifting region): the doping concentration is different, and the doping concentration of the invention is lower than that of the conventional nanowire MOS transistor; and
3) The invention discloses that an insulating dielectric with a low relative dielectric constant is filled between the back-tracks of the S-shaped drifting region, which is different from that only silicon dioxide is filled in the conventional nanowire MOS transistor.

Figure 2:
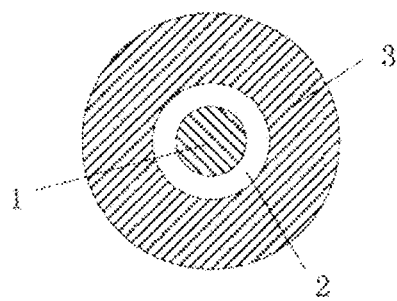
FIG. 2 is a schematic diagram showing the cross-section of a nanowire structure, wherein:
1-channel region, 2-gate dielectric (ring cover), 3-gate region (ring cover)

At the same time, the difference between the structure according to the invention and that of a conventional LDMOS transistor lies in that the following.
1) As shown in FIG. 2, the channel region of the invention has a surrounding gate structure, which is favourable to reduce short channel effect and meanwhile to avoid drain/substrate leakage current and breakdown.
2) The flow direction of carriers in the connection region between the channel part and the drain region is different. In the invention, carriers flow along the S-shaped back-track region; however, in a conventional LDMOS, carriers flow planarly in a single direction or flow in a direction vertical to the silicon wafer.

The above various differences are favourable to increase the high voltage-resistant capability of a lateral double-diffused transistor based on a silicon nanowire MOS transistor.

The invention may realize an n-type and a p-type lateral double-diffused transistor based on a silicon nanowire MOS transistor. As shown in FIG. 1, if the source region, the drain region and the source end extension region are selected to be n-type heavily doped and the drain end S-shaped drifting region is selected to be n-type lightly doped, an n-type lateral double-diffused transistor based on a silicon nanowire MOS transistor may be realized. If the source region, the drain region and the source end extension region are selected to be p-type heavily doped and the drain end S-shaped drifting region is selected to be p-type lightly doped, a p-type lateral double-diffused transistor based on a silicon nanowire MOS transistor may be realized.

Figure 3:
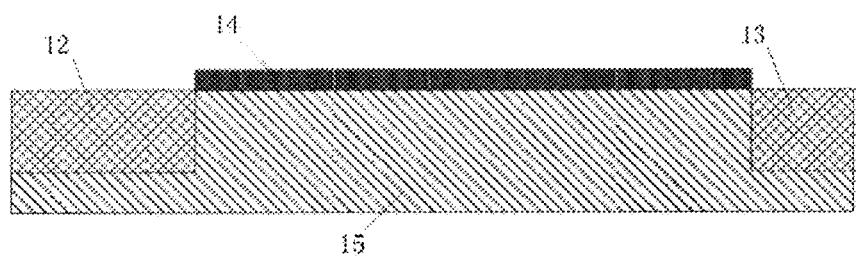
Figure 4:
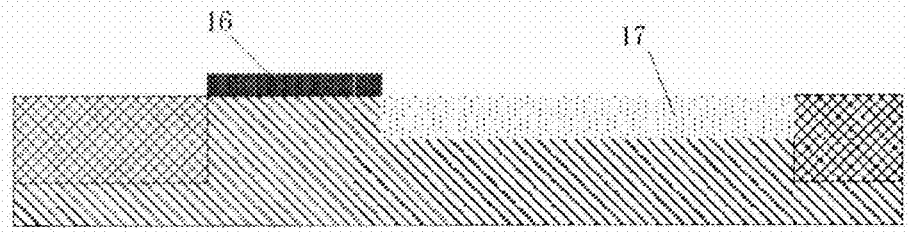
Figure 5:
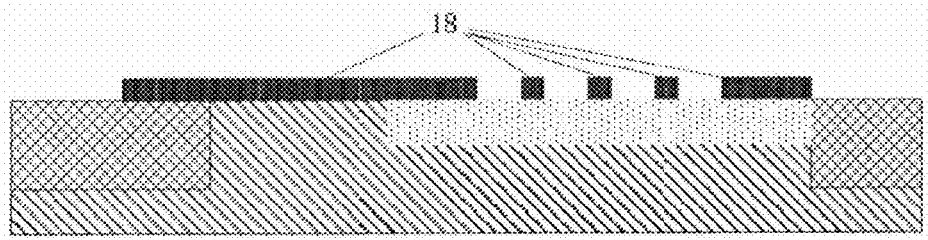
Figure 6:
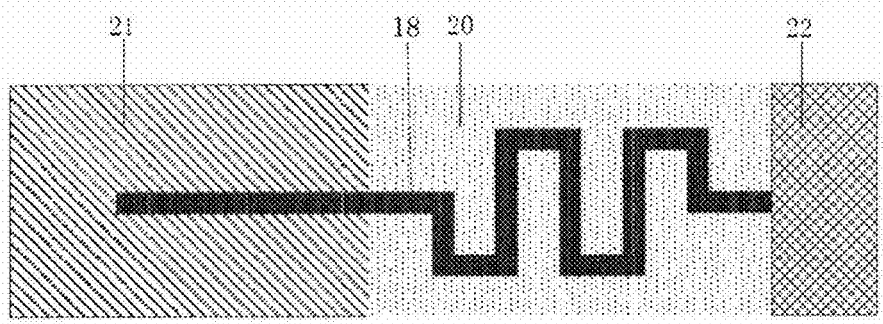

The manufacturing process is illustrated below via an example in which an n-type lateral double-diffused transistor based on a silicon nanowire MOS transistor is manufactured.
1) A bulk silicon wafer is selected and a source region, a drain region and high-concentration n-type doping region are defined by using a hard mask. Particularly, the doping concentration is in the range of $10^{20}$-$10^{21}$ cm$^{-3}$, the depths of the source region and the drain region are 100 nm-1 μm, as shown in the side sectional view of FIG. 3.
2) The hard mask of step 1) is removed, a lightly-doped region is defined by using another hard mask, and a n-type doping with a low concentration is performed so as to prepare for the formation of the drain end S-shaped drifting region. Particularly, the doping concentration is $10^{12}$-$10^{18}$ cm$^{-3}$, as shown in the side sectional view of FIG. 4. Since the source and drain regions defined in step 1) have n-type impurities of high-concentration, the step 2) will not influence the source and drain region.
3) The hard mask of step 2) is removed, and an S-shaped hard mask is formed, as shown in the side sectional view of FIG. 5 and the plan view in FIG. 6. Particularly, the plan view of the drain end S-shaped drifting region is in the form of single or multiple S-shaped structure(s), the total length is 1

μm-2 μm, the size of each back-track in the S-shaped structure is 50 nm-100 nm (longitudinal)×100 nm-200 nm (lateral), and the number of S-shaped back-tracks is in the range of 1-5.

Figure 7:
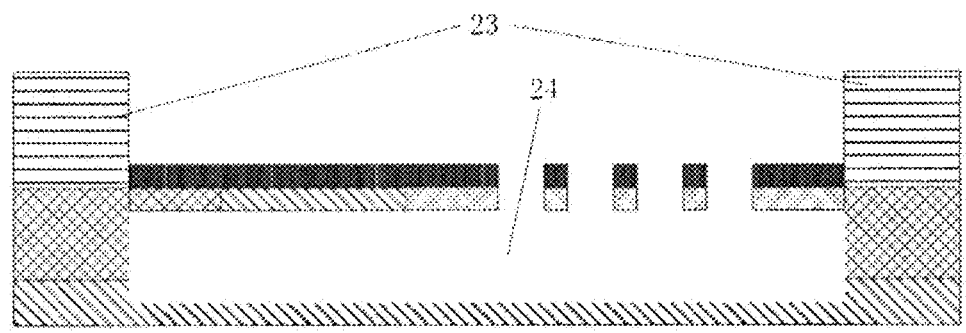

4) A thick oxide layer is deposited, and the isotropically etching is performed to the silicon substrate under the source end extension region, the channel region and the drain end S-shaped drifting region so that the underpart is hollowed, and the hollowed depth is 100 nm-1 μm, as shown in FIG. 7.

Figure 8:
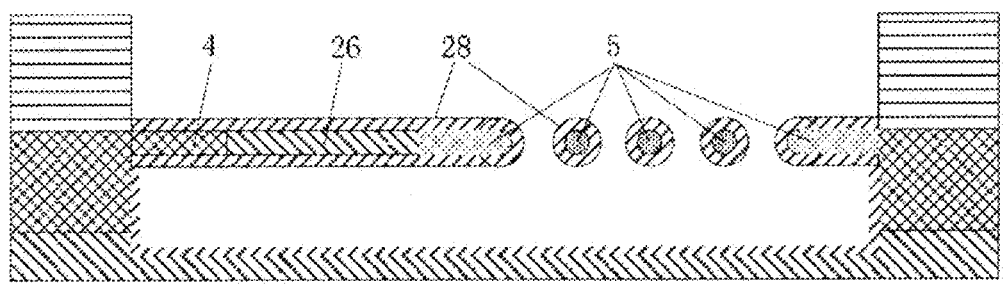

5) The hard mask is removed, the source end extension region, the channel region and the drain end S-shaped drifting region are oxidized and thinned, and a layer of surrounding gate dielectric is formed for the channel region at the same time. The cylinder radius is in the range of 3-5 nm, and the thickness of the gate dielectric is in the range of 1-2.5 nm, as shown in FIG. 8.

Figure 9:
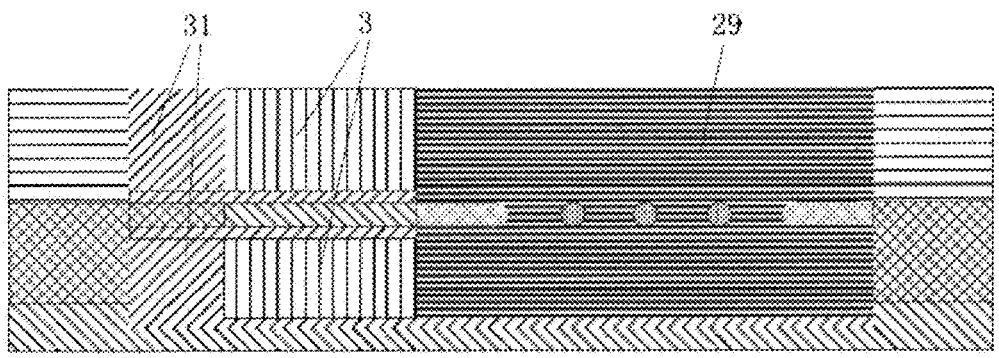

6) A gate region with a thickness range of 10 nm-5 μm is formed, the source end extension region is filled with silicon dioxide, the layer of silicon dioxide covered on the drain end S-shaped drifting region is removed, and the drain end S-shaped drifting region is filled with an insulating dielectric having a low relative dielectric constant. Particularly, the relative dielectric constant of the insulating dielectric is 1-4, as shown in FIG. 9.

Via a multiple back-track S-shaped structure with a low doping concentration and the material with a low relative dielectric constant filled between the S-shaped back-tracks, the drain end S-shaped drifting region make more potential drop in the insulating material between the back-tracks, so that the maximum electric-field strength in the direction of the carrier path from the channel region to the drain region may be lowered, and the electric field distribution in the direction of the carrier path is uniform, and the avalanche breakdown effect that may be caused by a high intensity electric field is avoided, which is favourable to increase the breakdown voltage of the elements.

The subsequent technological processes are completely the same as those of a conventional silicon nanowire MOS transistor, wherein following processes are performed sequentially: planarizing, depositing an isolation layer, lithographying a lead wire hole, depositing a metal, lithographying a lead wire and passivating, etc.

The lateral double-diffused transistor based on a silicon nanowire MOS transistor according to the invention has been described above in detail with specific examples, but the above application situations and embodiments are not intended to limit the invention. Various modifications and variations may be made by those skilled in the art without departing from the spirit or scope of the invention. Therefore, the protection scope of the invention is defined by the appended claims.

The invention claimed is:

1. A lateral double-diffused MOS transistor, comprising a channel region, a gate dielectric, a gate region, a source region, a drain region, a source end extension region and a drain end S-shaped drifting region, wherein the channel region has a lateral cylindrical silicon nanowire structure, on which a layer of gate dielectric is uniformly covered, the gate region is on the gate dielectric, the gate region and the gate dielectric completely surround the channel region, the source end extension region lies between the source region and the channel region, the drain end S-shaped drifting region lies between the drain region and the channel region, the drain end S-shaped drifting region is in a form of single or multiple S-shaped structure, and an insulating material with a relative dielectric constant of 1-4 is filled within the S-shaped structure.

2. The transistor according to claim 1, wherein a length of the drain end S-shaped drifting region is 1 μm-2 μm, a size of each back-track in the S-shaped structure is 50 nm-100 nm (longitudinal)×100 nm-200 nm (lateral), and the number of S-shaped back-tracks is in the range of 1-5.

3. The transistor according to claim 2, wherein the doping concentration of the drain end S-shaped drifting region is $10^{12}$-$10^{18}$ cm$^{-3}$.

4. The transistor according to claim 1, wherein the channel region is not doped, and has a length in the range of 10 nm-10 μm and a radius in the range of 3-5 nm.

5. The transistor according to claim 1, wherein a thickness of the gate dielectric is in the range of 1-2.5 nm, and a thickness of the gate region is in the range of 10 nm-5 μm.

6. The transistor according to claim 1, wherein the source region is flush with the drain region at upper and lower surfaces, and high-concentration doping is employed, wherein a doping concentration is in the range of $10^{20}$-$10^{21}$ cm$^{-3}$.

7. The transistor according to claim 1, wherein a doping concentration of the source end extension region is the same as that of the source region, a length of the source end extension region is in the range of 20 nm-100 nm, and the doping concentration of the source end extension region is in the range of $10^{20}$-$10^{21}$ cm$^{-3}$.

* * * * *

UNITED STATES PATENT AND TRADEMARK OFFICE
CERTIFICATE OF CORRECTION

PATENT NO. : 8,564,031 B2  Page 1 of 1
APPLICATION NO. : 13/381633
DATED : October 22, 2013
INVENTOR(S) : Ru Huang et al.

It is certified that error appears in the above-identified patent and that said Letters Patent is hereby corrected as shown below:

Title Page, below Item (65) insert

-- (30)   Foreign Application Priority Data
Jan. 27, 2011   (CN) ........................... 201110029706.7 --

Signed and Sealed this
Twenty-seventh Day of May, 2014

Michelle K. Lee
*Deputy Director of the United States Patent and Trademark Office*